United States Patent [19]

Janes et al.

[11] 4,024,399

[45] May 17, 1977

[54] METHOD AND APPARATUS FOR MEASURING VAPOR FLOW IN ISOTOPE SEPARATION

[75] Inventors: George S. Janes, Lincoln; Leonard N. Litzenberger, Andover, both of Mass.

[73] Assignee: Jersey Nuclear-Avco Isotopes, Inc., Bellevue, Wash.

[22] Filed: Jan. 6, 1975

[21] Appl. No.: 538,922

[52] U.S. Cl. .................. 250/423 P; 250/299; 250/300; 219/121 EB
[51] Int. Cl.² .................................. H01J 39/34
[58] Field of Search .......... 250/300, 299, 288, 281, 250/492 A, 423 P; 219/121 EB, 121 EM

[56] References Cited

UNITED STATES PATENTS

| | | | |
|---|---|---|---|
| 2,470,745 | 5/1949 | Schlesman | 250/300 |
| 3,247,373 | 4/1966 | Herzog et al. | 250/299 |
| 3,370,171 | 2/1968 | Ohta | 250/299 |
| 3,390,249 | 6/1968 | Hanks | 219/121 EB |
| 3,435,208 | 3/1969 | Hansen et al. | 250/425 |
| 3,510,647 | 5/1970 | Wood | 250/300 |
| 3,689,766 | 9/1972 | Freeman | 250/492 A |
| 3,772,519 | 11/1973 | Levy et al. | 250/288 |
| 3,842,267 | 10/1974 | Genequand | 250/300 |
| 3,857,090 | 12/1974 | Chick | 250/492 A |

*Primary Examiner*—Alfred E. Smith
*Assistant Examiner*—Bruce C. Anderson
*Attorney, Agent, or Firm*—Weingarten, Maxham & Schurgin

[57] ABSTRACT

A probe for detecting the evaporation rate of an electron beam evaporation source and for monitoring induced ionization of the vapor. A negatively biased electrode responds to ions in the vapor to measure the ion current density. The ions measured may result from the process of vaporization or from laser produced isotopically selective ionization. The probe provides a current output which is detected as an indication of vaporization or laser ionization rate.

19 Claims, 8 Drawing Figures

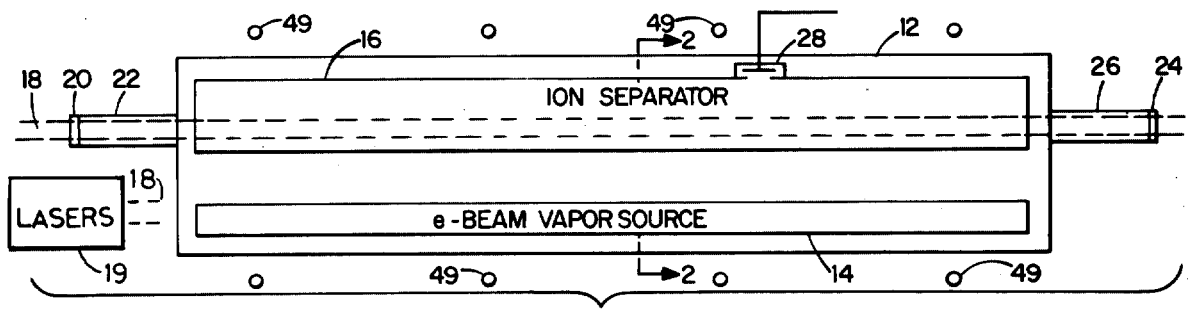

METHOD AND APPARATUS FOR MEASURING VAPOR FLOW IN ISOTOPE SEPARATION

FIELD OF THE INVENTION

This invention relates to the measurement of the rate of vaporization of a material and in particular to a probe for measuring the ion current density in the vaporized material.

BACKGROUND OF THE INVENTION

In uranium enrichment by isotopically selective photoionization of a uranium vapor, such as described in U.S. Pat. Nos. 3,772,519 and 3,939,354 and Pat. application Ser. No. 469,407, filed May 13, 1974, all incorporated herein by reference, there is described apparatus for generating a flowing uranium vapor in which particles of a desired isotope type are selectively ionized.

The rate at which uranium vapor is generated, typically by an electron beam evaporation source, and the distribution of the flow are important system parameters to know and control. Several techniques are available for making this measurement of uranium evaporation rate and include measuring the electron beam current or power input, detecting the accumulation of a deposit from the vapor, detecting the atomic density related to a reference density, and monitoring the emissions of the excited vapor as it passes through the electron beam. These all possess deficiencies in accuracy, reliability or ease of use.

Additionally, in such applications as laser enrichment where further isotopically selective ionization is produced in the vapor flow, it is desired to monitor the operation of this ionization mechanism as well as ion collection effectiveness against a known background ionization in the vapor flow for use in regulation or adjustment of the ionization process.

BRIEF SUMMARY OF THE INVENTION

In a preferred embodiment of the present invention as applied to laser enrichment, a fast time response probe is provided for indicating the vaporization rate from an electron beam vapor source and for monitoring the system ionization rate. The probe is based upon the appreciation that electron beam evaporation of a material such as metallic uranium will produce a relatively constant, low percentage of ions in the metallic vapor which correspondingly provide an ion current density in the vapor flow which is a function of vaporization rate.

In the probe apparatus of the present invention, a negatively biased electrode is placed in the path of vaporized material to collect ions over a predetermined area. The electrode bias is selected to repel electrons which also exist in the vapor so that the only charged particles striking the electrode are positively charged ions. A current path is provided from the electrode through indicating instruments so that a current may flow through this circuit in response to the ions which strike the electrode.

To minimize the nonlinear effect on probe response from sheath effects or the build-up of a space charge separation, the probe may be configured in one of several alternative structures including an embodiment having a guard ring of potential similar to that of the electrode, or a grounded screen in front of the electrode.

The probe may be operated to receive ions in the vapor flow without selectively created ions in order to establish a background ion current density and corresponding vaporization rate. Detection of this flow rate permits adjustment of the vaporization apparatus to a desired operating point.

The detected ion current density resulting from vaporization processes then becomes a system constant permitting detection of the degree of isotopically selective ionization resulting from laser radiation applied to the vapor. With both of these current densities held constant, the effect of ion collection forces may also be studied.

The fast response of the probe of the invention allows periodic updating of the vapor flow rate and background ion current density by interruptions in the application of the collection forces and laser radiation.

BRIEF DESCRIPTION OF THE DRAWING

These and other features of the present invention are more fully described below in the detailed description of the preferred embodiment, presented for purposes of illustration and not by way of limitation, and in the accompanying drawing of which:

FIG. 1 is a schematic diagram of isotope separation apparatus employing the invention;

FIG. 2 is an interior sectional view of the apparatus for isotope separation of FIG. 1 further illustrating the probe of the present invention;

FIGS. 3–7 are detailed representations of probes of the invention according to several embodiments for use in the isotope separation apparatus of FIGS. 1 and 2; and FIG. 8 is a graph representing a voltage versus current characteristic for the probe of the present invention useful in explaining its operation.

DETAILED DESCRIPTION OF THE PREFERRED EMBODIMENT

The present invention contemplates a probe for measuring the evaporation rate of a material, typically uranium metal, and for monitoring the operation of an ionization and collection process applied to the vapor. The probe is structured to measure ion current density in a defined cross-sectional area of the vapor flow.

The probe has particular application in the apparatus for uranium enrichment as described in the above-referenced U.S. Pat. Nos. 3,772,519 and 3,939,354 and U.S. patent application Ser. No. 469,407.

Apparatus for laser enrichment of uranium as generally described there includes a vacuum chamber 12, illustrated in FIG. 1, and operated at pressure of approximately $10^{-5}$ torr. Within chamber 12, an electron beam vapor source 14 generates a radially expanding flow of uranium vapor. The vapor flow is directed upward into an ion separator 16 to which a beam 18 of lasers 19 having typically several frequencies is applied to produce isotopically selective photoexcitation and ionization of the uranium vapor. The beam 18 is shown to enter the chamber 12 through a window 20 on a pipe 22 and exit the chamber 12 through a corresponding window 24 on a pipe 26. A probe 28 is placed in an upper panel of the ion separator 16 according to the present invention to intercept a small portion of the generated uranium vapor for detecting the ion current density resulting from vaporization alone or in combination with laser induced isotopically selective photoionization. Several probes similar to probe 28 may be utilized to detect variations in vapor distribution throughout the enrichment apparatus.

As shown in interior section in FIG. 2, the ion separator is placed directly above a line of vaporization 30 of a mass 32 of uranium metal in the crucible 34 of the electron beam evaporator 14. The evaporation provided along the surface of the uranium mass 32 at the line 30 where an electron beam 36 from a filamentary source 38 strikes it will produce a predetermined percentage of ions in the vapor as specified by the Saha equation and electron impact ionization calculations. The percent of ions in the generated vapor will be also a relatively fixed quantity, approximately 1% for the specified condition of operation.

The uranium vapor generated from the line of vaporization 30 expands into the ion separator 16 containing a plurality of chambers 40 which are defined by a cylindrical, electrically conducting rear panel 42 and conducting, radially extending side panels 44. The panels 42 and 44 are connected together and connected through a 60 volt pulse source 45 to electrodes 46 centrally placed within each chamber 40 to effect a magnetohydrodynamic acceleration on ions within the chambers 40 in conjunction with a 150 gauss magnetic field 48 created within the chamber 12 by exterior coils 49 shown in FIG. 1. Laser radiation is applied in bands 50 of reflected radiation within the chambers 40 to photoexcite the selected isotope and ions are produced by further laser radiation as specified above or by electron impact. A magnetohydrodynamic acceleration produced on the ions by the crossed magnetic field and pulsed voltage directs them toward one of the side panels 44 for collection.

Several specific probe constructions for utilization within the chamber 12 of FIGS. 1 and 2 are illustrated in FIGS. 3–7. In particular with respect to FIG. 3, a section of the plate 42 is perforated with an aperture 52 to permit an electrical lead 54 to pass therethrough to an electrode 56 insulatingly supported away from the plate 42 by at least several Debye lengths. The electrode 56 has a substantial area facing the vapor 58 and electrode 56 is biased negatively by approximately 200 volts with respect to the plate 42 by a voltage source 62 connected on one end to the lead 54 after passing through a side wall 60 of the chamber 12. The voltage source 62 has a by-pass capacitor 64 across it and is connected from its other terminal through a potentiometer 66 and a lead 68 to the plate 42 typically at ground potential. The wiper arm on the potentiometer 66 provides an input to an amplifier 70 which may be used to drive a meter 72 to provide an output indication of the level of ion current striking the probe electrode 56. The output of the amplifier 70 is also applied through a resistor 76 to a current summing input of an amplifier 74. A further current input is applied from a reference 80 through a resistor 78. In this manner, the output of the amplifier 74 may be applied to a control input for a power supply 82 for the filamentary electron beam source 38 of the electron beam 36. The monitored ion current in the vapor flow 58 is used as an evaporation rate sensor in a feedback loop for the power supply 82 to maintain a predetermined vaporization rate as determined by the selection of the amplitude of the reference 80.

The percentage of ions in the uranium vapor generated by electron beam evaporation is a generally constant number. By biasing negatively the electrode 56 with respect to the rest of the separation plates, the electrode 56 can be made to respond only to positively charged particles of which the ions will be the major component in the vapor flow 58. Thus, the current flowing through the potentiometer 66 is made to represent only ions. FIG. 8 shows a representation of the current versus voltage bias response of the electrode placed in the vapor flow. As can be seen from FIG. 8, at a negative potential on the probe electrode of a little less than −100 volts in magnitude, the probe will respond only to ions. At more positive voltages, the current will include an electron current which masks the level of ions striking the electrode 56. A negative bias of approximately 200 volts is selected to provide a conservative margin beyond the point where the probe becomes strictly ion responsive.

It might be desirable to use the feedback loop system of FIG. 3 only in periods where laser radiation and voltage from source 45 are not present in order to monitor only effects strictly related to the generation of vapor and not to laser ionization and separation forces unless these effects on ion flow are kept constant. Additionally, however, the effect of laser ionization may be monitored by detecting the difference between the ion current when the laser systems are off and when they are on. Similarly, the effect of the crossed-field magnetohydrodynamic separation forces can be monitored as the difference between ion current when the evaporation and laser systems are on with the crossed-field separation and without the crossed-field separation forces.

Respecting FIG. 4, a further form for the probe of the invention is illustrated wherein an electrode 86 is placed in an aperture in the plate 42 with its measuring area generally co-planar with the inward surface of the plate 42. The current flowing in the circuit of voltage source 62 and by-pass capacitor 64 is measured in a meter or meter system 88. An embodiment illustrated in FIG. 5 employs the probe configuration of FIG. 4 having a central measuring electrode 90 surrounded by a guard ring electrode 92. In order to decouple the guard ring 92 from the measuring electrode 90, the electrode 90 is biased from the voltage source 62 through a resistor 94, while the guard ring electrode 92 is energized directly from the bias source 62. The indication of the ion current on the probe 90 is derived through a differential amplifier 96 measuring the potential across the resistor 94 and applying its output to a metering system 98 or to the feedback system illustrated in FIG. 3. The system illustrated in FIG. 5 provides a benefit in overcoming distortions in the measurement of the FIG. 4 or FIG. 3 system resulting from electrostatic field configuration and space charge effects.

A configuration of FIG. 6 also provides an advantage in this regard. As shown there, a section 100 of the plate 42 has a recess 102 in which an electrode 104 is placed as the measuring electrode to receive the vapor flow through an aperture 106. The area of the aperture 106 is substantially less than that of the probe 104 to overcome the potential fringe field and space charge problems. In FIG. 7, a similar probe configuration employing an electrode 110 within a similar cavity 116 of the plate 42 is provided with the exception that an aperture 114 corresponds substantially in area to the ion receiving area of the electrode 110 and has across it a screen 112 to distribute the electric field evenly across the surface of the electrode 110.

All of the probe configurations are useful in the feedback control system of FIG. 3 for vaporization rate control, or for use in monitoring vaporization rate, efficiency of selective ionization, and of ion separaton forces. The probe of the present invention may also be used for detection of nonconductive materials if the electrode 56 is sufficiently hot to revaporize the collected vapor particles.

The above exemplary description of the invention is intended for illustrative purposes only. It is recognized that alternatives and modifications exist within the spirit of the present invention as defined in the following claims.

What is claimed is:

1. A system for detecting the rate of vaporization of neutral particles of a material comprising:
   a vapor source generating a vapor of neutral particles of said material and having a portion of ions in the vapor particles generated from said material as a result of vaporization;
   a probe positioned from said vapor source to intercept a percentage thereof, said probe comprising:
   an electrode having an ion receiving surface facing the flow of vapor from said vapor source;
   means for biasing said electrode with respect to said vapor source to provide a negative bias on said electrode which repels from said electrode negatively charged particles in the generated vapor; and
   means for providing an output signal representative of the rate at which ions are collected by said electrode.

2. The system of claim 1 further including:
   an apertured plate;
   said electrode being supported generally to receive the vapor flow incident on said aperture;
   said apertured plate being at a positive potential with respect to the electrode.

3. The system of claim 2 wherein said electrode has its ion receiving surface located generally within the aperture of said apertured plate.

4. The system of claim 3 further including:
   a guard ring surrounding said electrode in the aperture of said apertured plate; and
   means for biasing the guard ring to generally the same potential as said electrode with respect to said apertured plate.

5. The system of claim 2 wherein said electrode is placed beyond said aperture to receive the vapor flow therethrough and further has the area of its ion receiving surface substantially larger than the area of said aperture.

6. The system of claim 2 wherein said electrode is placed beyond said aperture to receive the vapor flow therethrough and further including a conductive screen across the aperture of said apertured plate and electrically connected thereto.

7. The system of claim 1 wherein:
   a resistor is provided;
   said biasing means includes a voltage source and a capacitance in parallel therewith;
   said voltage source and said capacitor being in series with said resistor across said electrode and said vapor source whereby said voltage source provides a potential between said electrode and said vapor source through said resistor;
   said output signal providing means being responsive to the potential across said resistor.

8. The system of claim 7 wherein said output signal providing means includes a voltage indicator.

9. The system of claim 1 wherein said vapor source includes: means for applying an electron beam to the surface of said material to provide vaporization thereof.

10. The system of claim 9 further including means for controlling the electron beam in response to the output signal to maintain generally constant the rate at which ions are collected by said electrode whereby the vaporization rate is regulated.

11. The system of claim 1 further including:
    selectively actuable means for receiving the vapor from said vapor source to provide isotopically selective ionization by way of isotopically selective photoexcitation of vapor particles.

12. The system of claim 11 wherein said output signal providing means provides said output signal representative of vaporization ionization together with isotopically selective ionization when said selectively actuable means is operative.

13. The system of claim 11 further including means for separately collecting the ions in said vapor.

14. The system of claim 13 wherein said output signal represents the effect of said collecting means on the ions produced by vaporization and isotopically selective ionization.

15. The system of claim 1 wherein said vapor is of uranium metal.

16. A process for monitoring vaporization rate in a system for isotope separation comprising the steps of:
    generating a vapor flow of neutral particles having a percentage of ions therein of a material having plural isotopes of which at least one isotope type is to be separated;
    providing a negtive electrical bias to an electrode placed to receive the vapor flow;
    the negative bias being of a magnitude to suppress collection of electrons by said electrode and to promote the collection of ions by said electrode;
    detecting the rate at which ions are collected by said electrode to provide an output signal representation of vaporization rate.

17. The process of claim 16 further includes the step of:
    controlling the generation of the vapor flow in response to the output signal to provide a generally constant rate of collection of ions on said electrode thereby regulating the rate of vaporization.

18. The process of claim 16 further including the step of:
    providing a limited period of isotopically selective ionization by way of isotopically selective photoexcitation of the one isotope type in said vapor flow whereby the difference in output signal between conditions of selective ionization and no selective ionization provides an indication of the efficiency of selective ionization.

19. The process of claim 18 further including the step of:
    separately collecting the selectively ionized isotope particles for a limited period whereby the difference in output signal between conditions of separate collection and no separate collection provides an indication of the efficiency of separate collection.

* * * * *